United States Patent
Hausmann et al.

(10) Patent No.: US 7,745,346 B2
(45) Date of Patent: Jun. 29, 2010

(54) METHOD FOR IMPROVING PROCESS CONTROL AND FILM CONFORMALITY OF PECVD FILM

(75) Inventors: Dennis Hausmann, Lake Oswego, OR (US); James S. Sims, Tigard, OR (US); Andrew Antonelli, Portland, OR (US); Sesha Varadarajan, Lake Oswego, OR (US); Bart Van Schravendijk, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 12/253,807

(22) Filed: Oct. 17, 2008

(65) Prior Publication Data

US 2010/0099271 A1 Apr. 22, 2010

(51) Int. Cl.
 *H01L 21/31* (2006.01)
(52) U.S. Cl. ............... 438/778; 438/788; 438/792
(58) Field of Classification Search ............ 438/778, 438/787, 788, 791, 792; 118/723 R, 723 VE, 118/723 E
See application file for complete search history.

(56) References Cited

U.S. PATENT DOCUMENTS

| | | | |
|---|---|---|---|
| 5,231,057 A | 7/1993 | Doki et al. | |
| 6,573,030 B1 | 6/2003 | Fairbairn et al. | |
| 7,381,644 B1 | 6/2008 | Subramonium et al. | |
| 2004/0018750 A1 | 1/2004 | Sophie et al. | |
| 2004/0161941 A1* | 8/2004 | Donohoe et al. | 438/709 |
| 2004/0195659 A1* | 10/2004 | Grill et al. | 257/632 |
| 2008/0242116 A1* | 10/2008 | Clark | 438/791 |

OTHER PUBLICATIONS

Ikeda et al., "TOP-PECVD": A New Conformal Plasma Enhanced CVD Technology using TEOS, Ozone and Pulse-modulated RF Plasma, IEEE (1992), pp. 289-292.

* cited by examiner

*Primary Examiner*—Kevin M Picardat
(74) *Attorney, Agent, or Firm*—Weaver Austin Villeneuve & Sampson LLP

(57) ABSTRACT

A method for forming a silicon-based dielectric film on a substrate with a single deposition process operation using pulsed plasma enhanced chemical vapor deposition (PECVD) wherein the high frequency radio frequency power of the plasma is pulsed, allows enhanced control, efficiency and product quality of the PECVD process. Pulsing the high frequency RF power of the plasma reduces the deposited film thickness per unit time the high frequency RF power of the plasma is on. This yields silicon-based dielectric films that are both thin and conformal.

23 Claims, 8 Drawing Sheets

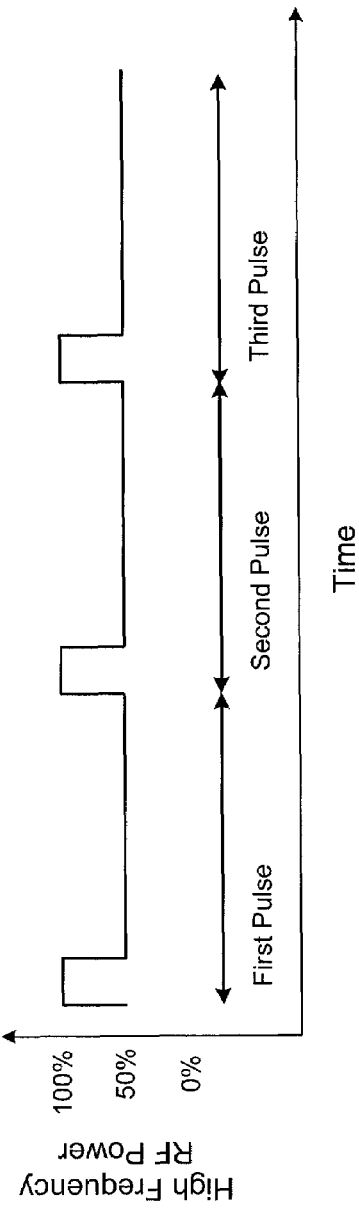
FIG. 4a
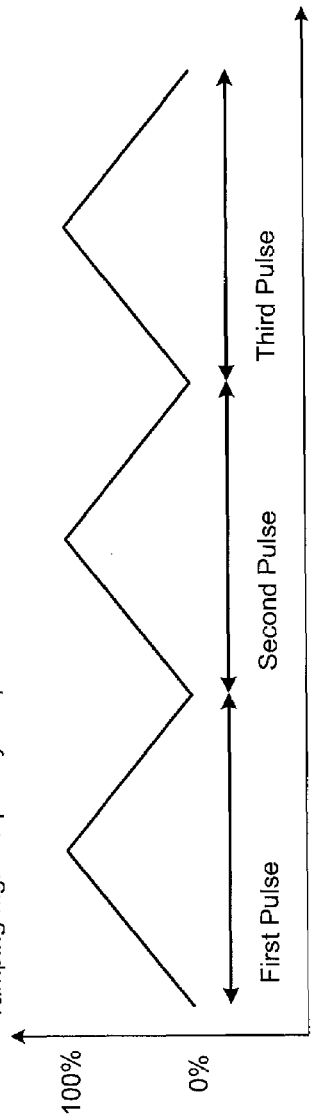
FIG. 4b
FIG. 4

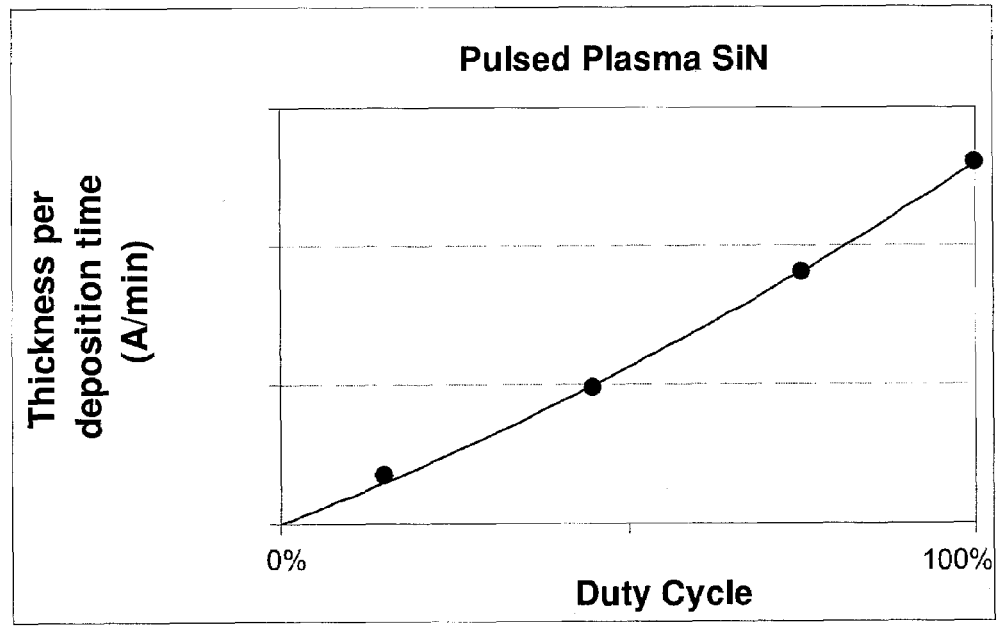
FIG. 6a
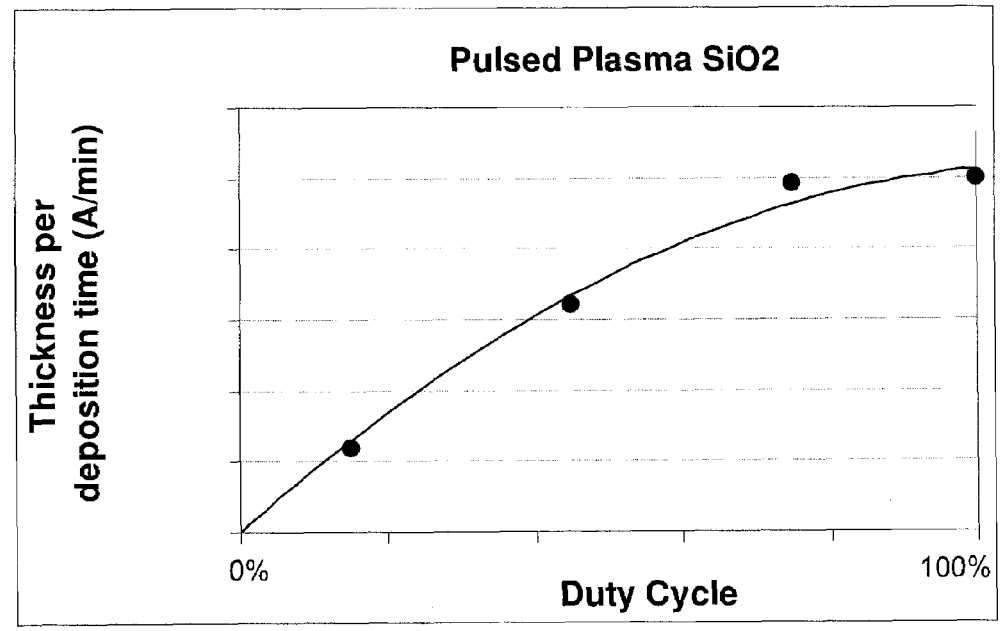
FIG. 6b
FIG. 6

METHOD FOR IMPROVING PROCESS CONTROL AND FILM CONFORMALITY OF PECVD FILM

FIELD OF THE INVENTION

This invention relates to the formation of silicon-based dielectric films in semiconductor processing.

BACKGROUND OF THE INVENTION

Both thin and conformal silicon-based dielectric films are used in numerous integrated circuit applications, including spacer applications, liner applications, and double patterning applications. Current plasma enhanced chemical vapor deposition (PECVD) methods for depositing these films using silane-based precursors often have deposition rates in excess of 120 nm/min. Such a deposition rate requires very short deposition times on the order of 1 second to achieve a thin film of nominal thickness 5 nm. Short deposition times can render reproducibility, both wafer-to-wafer and tool-to-tool, more challenging. Additionally, step coverage for conventionally deposited silane-based oxides is poor.

SUMMARY OF THE INVENTION

The present invention addresses this need by providing a method for forming a plasma enhanced chemical vapor deposition (PECVD) deposited silicon-based dielectric film with a more controllable deposition. The silicon-based dielectric films, including silicon oxide and silicon nitride, are produced by use of a PECVD process where the high frequency radio frequency (RF) power of the plasma is pulsed. The process allows for the production of thin films and films with good conformality (or step coverage) in a single pulsed plasma deposition process operation.

The present invention provides silicon-based dielectric films produced by use of a pulsed PECVD process. In the pulsed PECVD process, the high frequency RF power of the plasma is pulsed. The pulse characteristics may be varied by varying the pulse repetition frequency (frequency of turning the high frequency RF power on) and duty cycle (fraction of time during which the high frequency RF power is on). For example, for a pulse with a frequency of 500 Hz and duty cycle of 15%, one pulse period is 2 milliseconds with the high frequency RF power off for 1.7 milliseconds and on for 0.3 milliseconds.

In another aspect, the present invention pertains to a semiconductor processing apparatus configured for performing a PECVD process where the high frequency RF power of the plasma is pulsed. The semiconductor processing apparatus includes at least a chamber, a high frequency RF generator capable of pulsing the high frequency radio frequency power of the plasma, and a controller. The chamber includes a substrate holder, an inlet for process gases, and a connection to a vacuum source. The controller may be configured to execute a set of instructions to perform the pulsed PECVD process. The set of instruction may include injecting one or more precursor gases into the chamber and pulsing the high frequency RF power of the plasma.

These and other aspects and advantages of the invention are described further below and with reference to the drawings.

BRIEF DESCRIPTION OF THE DRAWINGS

FIG. 4 depicts timing sequence diagrams for other specific embodiments of the invention.

FIG. 6 depicts plots showing the effect of varying the duty cycle for the high frequency RF power of the plasma during pulsed PECVD deposition of silicon nitride (FIG. 6a) and silicon oxide (FIG. 6b) in accordance with one aspect of the present invention.

DETAILED DESCRIPTION OF THE INVENTION

Figure 1:
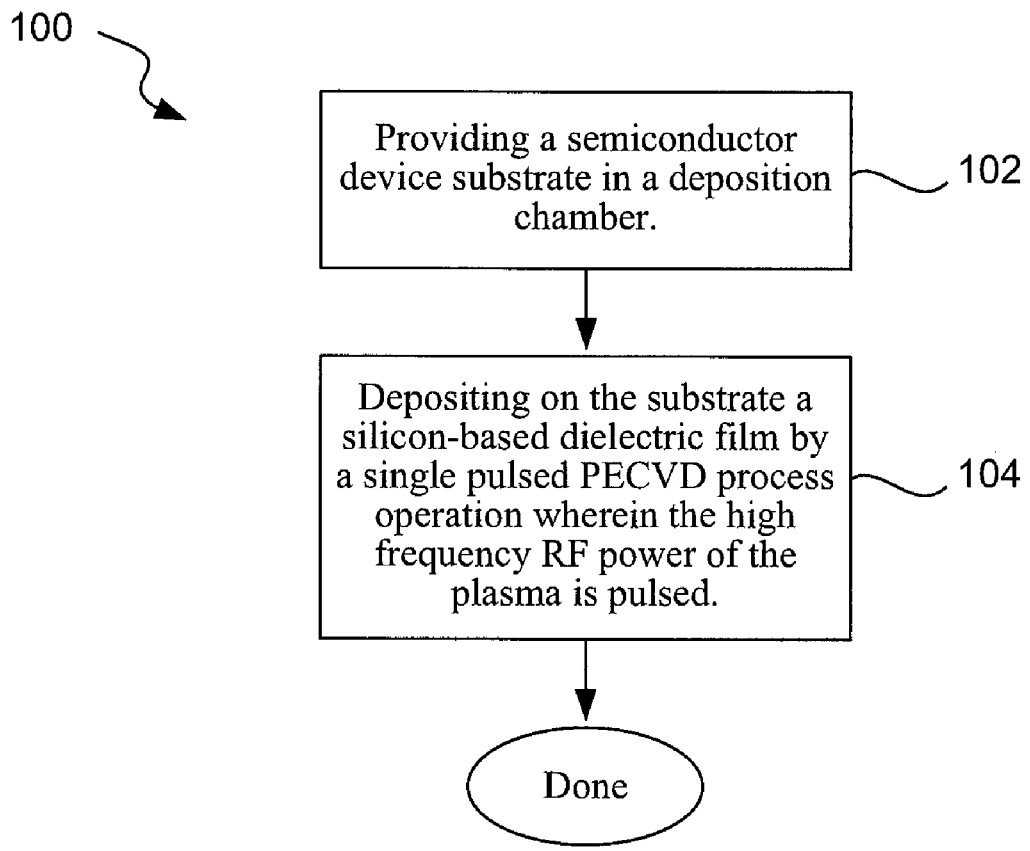
FIG. 1 depicts important stages in a general process flow for a method of forming a silicon-based dielectric film in accordance with the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

Both thin and conformal silicon-based dielectric films are used in numerous integrated circuit applications, including spacer applications, liner applications, and double patterning applications. These silicon-based dielectric films are generally silicon nitride or silicon oxide generally in thicknesses from 5 to 10 nm. Both silicon nitride and silicon oxide may be deposited on a surface using chemical vapor deposition (CVD) or one of its variants, such as plasma enchanced chemical vapor deposition (PECVD).

PECVD offers the advantage of being able to preform a CVD process at a lower temperature. In CVD, a substrate is exposed to one or more volatile precursors, which react and/or decompose on the substrate surface to produce the desired deposit. A CVD process requires an energy source to enhance the chemical reaction rates of the precursors. Typically, the energy source for CVD is thermal; i.e., increased temperature enhances the chemical reaction rates of the precursors. With PECVD, a plasma increases the reactivity of the precursors, allowing the deposition to be performed at a lower temperature.

One disadvantage of PECVD for integrated circuit applications is that with the increased reactivity of the precursors, the desired film may be deposited so fast that it is difficult to control the process. This can result in poor reproducibility, both wafer-to-wafer and tool-to-tool, of the silicon-based dielectric films. Additionally, step coverage for these films, especially for silane based oxides, is poor.

The present invention is a method that provides enhanced process control enabling deposition of silicon-based dielectric films that are thinner and more conformal than films produced with conventional PECVD. Switching the high frequency radio frequency (RF) power of the plasma on and off in a PECVD process, or pulsing this high frequency RF power, reduces the film thickness per deposition time (referred to as "thickness per deposition time"). Deposition time in this context is the time that a substrate is exposed to a pulsing plasma, regardless of the plasma duty cycle. In such a pulsed PECVD process, this reduction in thickness per deposition time makes the deposition process more controllable, making the process more reproducible (both wafer-to-wafer and tool-to-tool) and yielding both thin and conformal films. Deposition rate is calculated as the ratio of the measured thickness divided by the total deposition time (i.e., the time that the high frequency RF power is on and pulsing during the deposition process).

Specific applications of the present invention include the deposition of silicon-based dielectric films on bare silicon for through-silicon vias and on photoresist for double patterning, a photolithography technique.

Pulsed PECVD can be performed with existing semiconductor processing equipment by using a high frequency RF generator capable of pulsing the high frequency RF power of the plasma. In particular, PECVD reactors such as Vector™ reactor chambers available from Novellus Systems, Inc., San Jose, Calif., may be used for pulsed PECVD. Thus, improved silicon-based dielectric films may be made with minimal hardware alterations.

Pulsed PECVD Deposition Process

The invention provides silicon-based dielectric films, including silicon oxide, silicon nitride and their variants including doped variants, produced in a single deposition pulsed plasma process operation by use of a pulsed plasma enhanced chemical vapor deposition (PECVD) process. Pulsing the high frequency RF power of the plasma reduces the thickness per deposition time of a silicon-based dielectric film. This makes the deposition process easier to control, resulting in films that are thin and uniform and films with better conformality (or step coverage).

The pulse characteristics may be varied by varying the pulse repetition frequency (frequency of turning the high frequency RF power on and off) and duty cycle (fraction of time during which the high frequency RF power is on). A duty cycle of 100% means that the high frequency RF power is not pulsed. For example, for a pulse with a frequency of 500 Hz and duty cycle of 15%, one pulse period is 2 milliseconds with the high frequency RF power off for 1.7 milliseconds and on for 0.3 milliseconds. Further variations in the pulse characteristics are discussed below.

FIG. 1 depicts important stages in a general process flow for a method of forming a silicon-based dielectric film in accordance with the present invention. The method (100) involves providing a semiconductor device substrate in a deposition chamber (102) and depositing on the substrate a silicon-based dielectric film with a PECVD process wherein the high frequency RF power of the plasma is pulsed (104).

Figure 2:
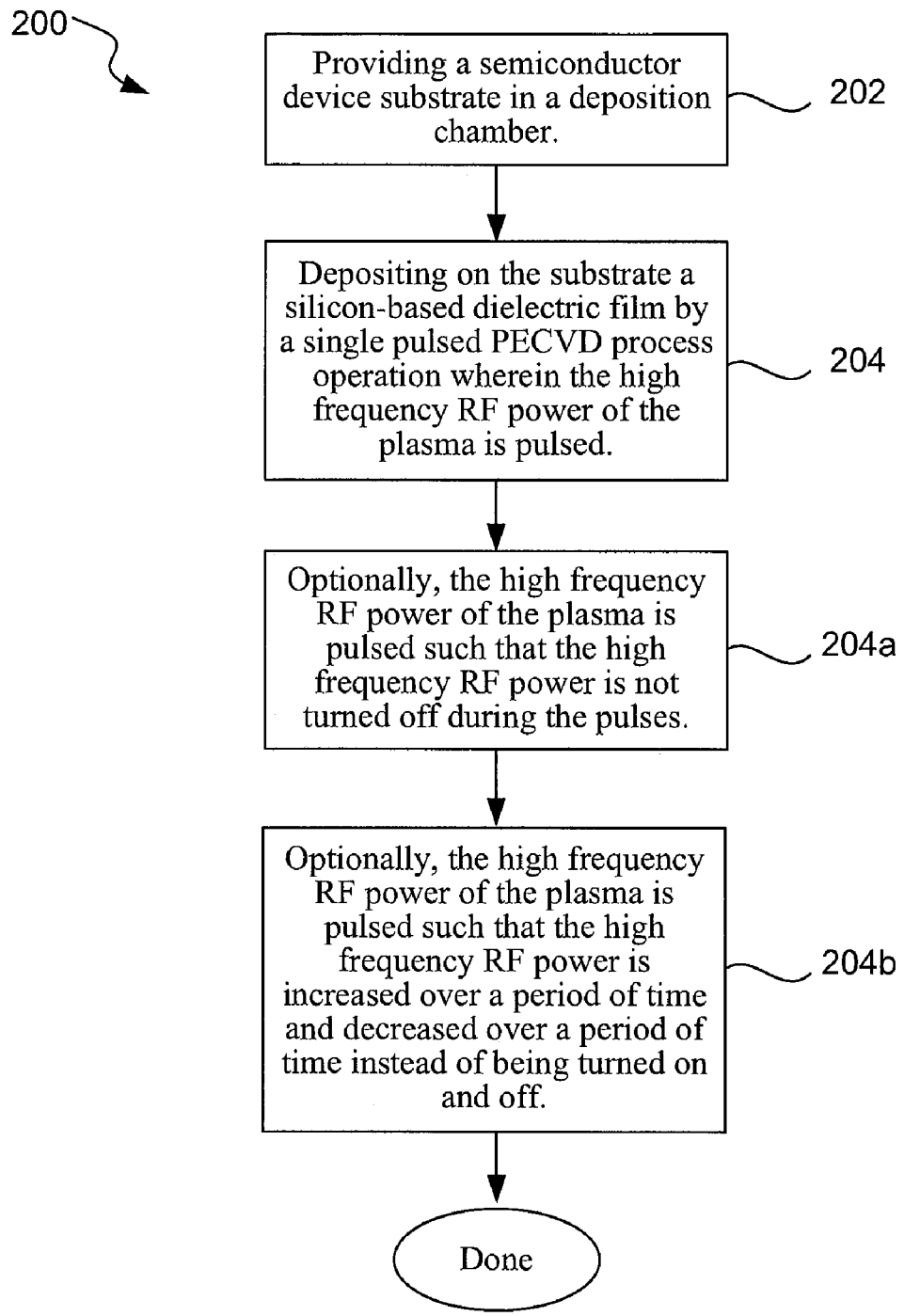
FIG. 2 depicts important stages in a general process flow for a method of forming a silicon-based dielectric film in accordance with specific embodiments of the present invention.

Deposition of a silicon-based dielectric film by a single pulsed PECVD deposition process operation can be accomplished by a deposition process with different pulse variations. FIG. 2 depicts a process flow for a method of forming silicon-based dielectric film according to specific embodiments of this aspect of the invention. The method (200) again involves providing a semiconductor device substrate in a deposition chamber (202).

The silicon-based dielectric film is deposited on the substrate by a PECVD process wherein the high frequency RF power of the plasma is pulsed (204). The pulse characteristic variations in 204a and 204b are discussed below.

In a pulsed PECVD process, the high frequency RF power generally has a frequency of 2 to 60 MHz; in a preferred embodiment, the high frequency RF power has a frequency of 13.56 MHz. The low frequency RF power in a pulsed PECVD process may be on or off during the process. When the low frequency RF power is on, it generally has a frequency of 50 to 500 kHz; in a preferred embodiment, the low frequency RF power has a frequency of about 400 kHz.

Suitable precursors used in pulsed PECVD to deposit a silicon-based dielectric film in accordance with the present invention can be generally the same precursors as used in PECVD performed without pulsing the high frequency RF power (i.e., conventional PECVD). Such precursors are generally a silicon precursor and a nitrogen precursor for silicon nitride or an oxygen precursor for silicon oxide. Specific examples of silicon precursors include silane and tetraethyl orthosilicate (TEOS). Silane is the preferred precursor in many applications. Specific examples of nitrogen precursors include ammonia, nitrogen, and hydrazine. Specific examples of an oxygen precursors includes nitrous oxide, oxygen, ozone, and water. Doped silicon-based dielectric films (i.e., silicon-based dielectric films with traces of other elements, such as carbon and hydrogen) may be formed by incorporating additional elements contained in the precursors into the films. Other precursors, such as will be apparent to or readily discernable by those skilled in the art given the teachings provided herein, may also be used.

Figure 3:
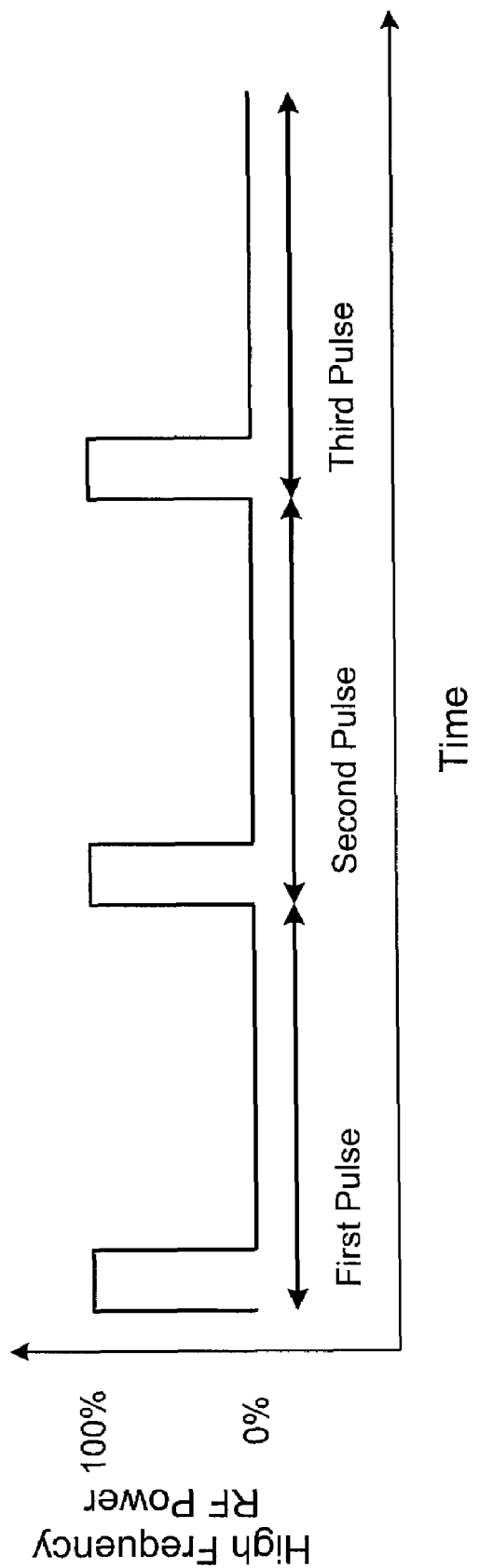
FIG. 3 depicts a timing sequence diagram for one specific embodiment of the invention.

FIG. 3 depicts a timing sequence diagram for one specific embodiment of the invention in which a silicon-based dielectric is formed by a single pulsed PECVD process operation having a 500 Hz high pulse frequency and a 15% duty cycle. This results in a pulse width of 2 milliseconds with a high frequency RF power on time of 0.3 milliseconds/off time of 1.7 milliseconds. Three pulses are shown in the figure. In other embodiments, the pulse frequency can be varied from 1 Hz to 10 kHz. In still other embodiments, the pulse frequency can be varied from 75 to 500 Hz and the duty cycle can be varied from about 15% to 99%.

Referring again to FIG. 2, other pulse characteristics may also be optionally varied. For example, the high frequency RF power of the plasma may be reduced and not turned off during the pulses (204a). For example, the high frequency RF power pulses could be 100% of the high frequency RF power when the pulse is on and 50% of the high frequency RF power when the pulse is off. In addition, or in the alternative, the high frequency RF power of the plasma may be increased over a period of time and decreased over a period of time instead of being turned on and off (204b).

FIG. 4 depicts timing sequence diagrams for other specific embodiments of the invention in which a silicon-based dielectric film is formed by a single pulsed PECVD process operation with the pulse characteristic variations as described above with reference to FIGS. 2, 204a and 204b. FIG. 4a depicts a timing sequence diagram in which a silicon-based dielectric film is formed by a pulsed PECVD process as described in FIG. 2, 204a. The pulse frequency is 500 Hz with a 15% duty cycle and the high frequency RF power is 50%, instead of being turned off, when the pulse is off. Three pulses are shown in the figure. In other embodiments, the power level (i.e., 0% to 100%) of the high frequency RF power when the pulse is off can be varied.

FIG. 4b depicts a timing sequence diagram in which a silicon-based dielectric film is formed by a single pulsed PECVD process operation as described in FIG. 2, 204b. The high frequency RF power pulse frequency is 500 Hz. Additionally, the high frequency RF power is increased from 0% to 100% over a 1 millisecond time period and then decreased from 100% to 0% over a 1 millisecond time period. This is in contrast to the timing sequence depicted in FIG. 3 where the high frequency RF power is not ramped from 0% to 100% and from 100% to 0%, but instead turned on and off. Three pulses are shown in the figure. In other embodiments, the time periods over which the high frequency RF power is increased and decreased can be varied. Additionally, the pulse characteristic variations described with reference to FIG. 2, 204a can be combined with the variation described above with reference to FIG. 2, 204b; i.e., a high frequency RF power timing sequence in which the high frequency RF power is never turned off, but, for example, ramped from 50% to 100% and then from 100% to 50%.

While the invention is not limited by any particular theory, it is believed that the pulsed PECVD process decreases the deposited film thickness per unit time the high frequency RF power of the plasma is on (referred to as "thickness per deposition time") as described below. The presence of a plasma during a CVD process lowers the activation energy for the CVD process by generating reactive species (radicals) in the precursors, thereby lowering the temperature at which the CVD process can be performed. These radicals are highly reactive with high sticking coefficients. This increases the film deposition rate but makes the deposition difficult to control, yielding films that are not conformal. In a single pulsed PECVD process operation in accordance with the present invention, a plasma is ignited for a short period of time during which radicals are generated. The plasma is then extinguished, reducing the number of radicals and reducing the reactivity of the precursors. By generating radicals with a plasma and then extinguishing the plasma to reduce the reactivity for a period of time, the thickness per deposition time decreases and improves the control of the process, yielding thin films and conformal films.

For example, pulsing the high frequency RF plasma power at 500 Hz with a 15% duty cycle dramatically improves the step coverage and decreases the thickness per deposition time for silane-based PECVD films. It should be noted that for silane-based films, duty cycle has the most significant effect on step coverage and thickness per deposition time. With currently manufactured high frequency RF power generators, the high frequency RF power of a plasma may be pulsed at 75-500 Hz. These generators are not capable of a sustaining a plasma at duty cycles lower than 15% or pulse frequencies greater than 500 Hz. Further improvements in the silicon-based dielectric films might be observed using the pulsed PECVD process with further decreases in duty cycle when generators capable of higher frequencies and lower duty cycles become available. However, with increases in pulse frequency and decreases in duty cycle, the high frequency RF power of the plasma must be on at least long enough to generate reactive species. If no reactive species are generated, the benefits of pulsed PECVD will not be realized.

It should also be noted that a film formation method in accordance with the present invention can be conducted in a single deposition process operation. Previous approaches to pulsed plasma deposition techniques have involved multiple deposition process operations, for example an initial thermal film deposition preceding a plasma deposition (e.g., cyclically repeated CVD and PECVD steps). Such multiple deposition process operation techniques obviously introduce additional complexity that detracts from the efficiency and controllability of the process, particularly with regard to the formation of thin, uniform films. Processes in accordance with the present invention avoid the drawbacks of multiple deposition process operations by providing a pulsed plasma enhanced chemical vapor deposition film formation technique in a single process operation.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple processing stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing a silicon-based dielectric film deposition is transferred from one station to another within a reactor chamber during the process. For example, for a 40 nm dielectric film deposition, 10 nm of film may be deposited at each of four stations in accordance with the present invention. Of course, the full film deposition may occur entirely at a single station or any fraction of the total film thickness may be deposited at any number of stations.

While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ reactor, produced by Novellus Systems of San Jose, Calif., may be used to implement the invention.

Figure 5:
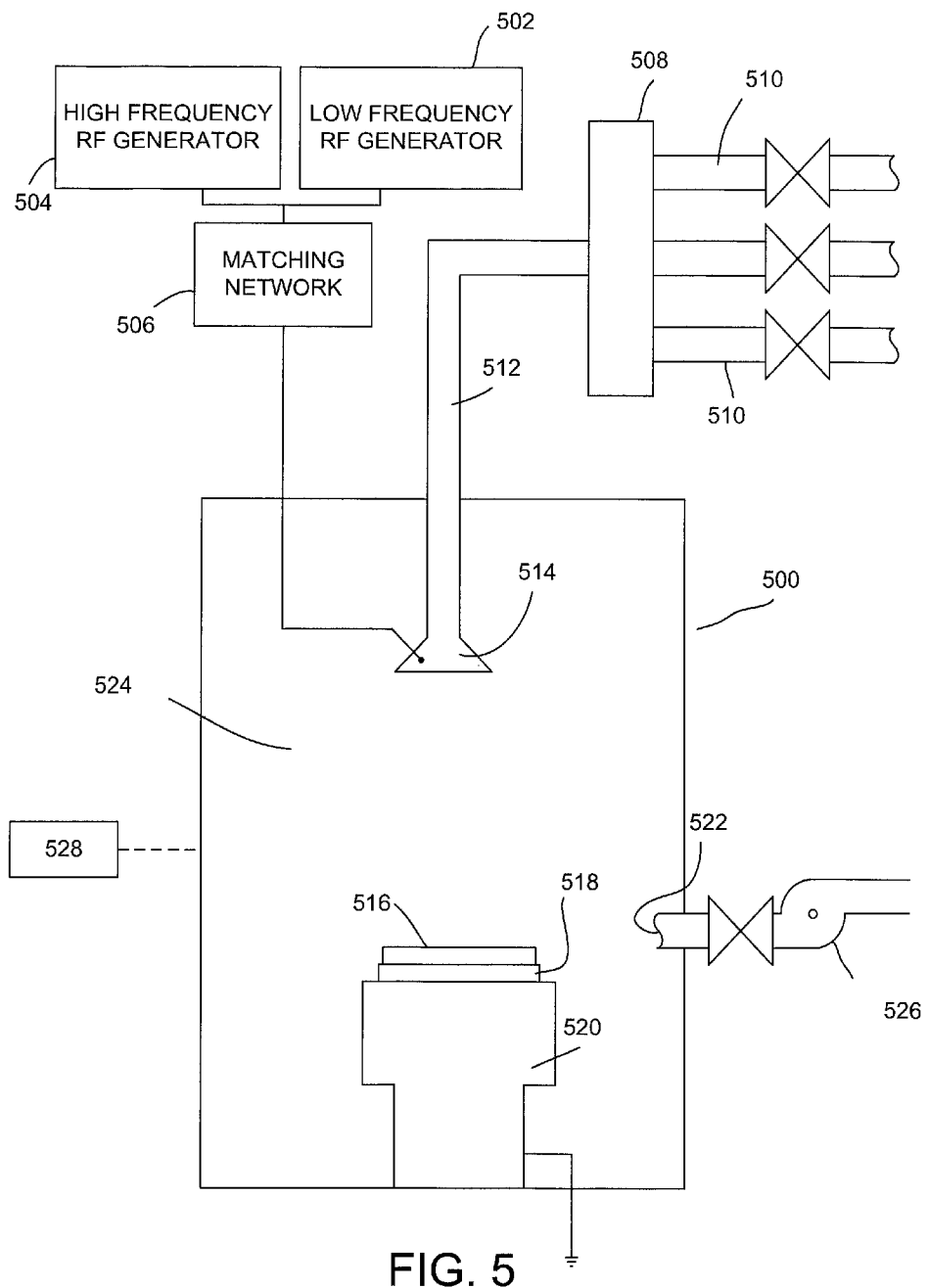
FIG. 5 is a simple block diagram depicting a reactor arranged for implementing the present invention.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high frequency radio frequency (RF) generator 504 and a low frequency RF generator 502, connected to a matching network 506, are connected to showerhead 514. The power of the high frequency RF generator 504 is capable of being pulsed. The power and frequency supplied by matching network 506 is sufficient to generate a plasma from the process gas, for example 400-700 W total power. In the implementation of the present invention the high frequency RF generator is pulsed and the low frequency RF generator may be on or off.

Within the reactor, a wafer pedestal 518 supports a substrate 516. The pedestal typically includes a substrate holder such as a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition process. In case a chemical precursor is delivered in the liquid form, liquid flow control mechanisms are employed. The liquid is then vaporized and mixed with other process gases during its transportation in a manifold heated above its vaporization point before reaching the deposition chamber.

Process gases exit chamber 524 via an outlet 522. A vacuum pump 526 (e.g., a one or two stage mechanical dry pump and/or a turbomolecular pump) typically draws process gases out and maintains a suitably low pressure (e.g., 0.01 to 10 Torr; frequently about 1 to 10 Torr) within the reactor by a close loop controlled flow restriction device, such as a throttle valve or a pendulum valve.

The apparatus may also include a controller 528 configured to execute a set of instructions. The set of instructions may include instructions to inject one or more process gases into the chamber and to pulse the high frequency RF power of the plasma. These instructions are to perform the operations in the method embodiment of the present invention. The set of instructions may also include instructions to perform conventional PECVD deposition.

The invention may be implemented on a multi-station or single station tool. In specific embodiments, the 300 mm Novellus Vector™ tool having a 4-station deposition scheme are used. It is possible to index the wafers after every deposition treatment until all the required depositions are completed, or multiple depositions can be conducted at a single station before indexing the wafer.

EXAMPLES

The following examples are provided to further illustrate aspects and advantages of the present invention. These examples are provided to exemplify and more clearly illustrate aspects of the present invention and are in no way intended to be limiting.

Film depositions for these examples were conducted in Novellus Vector™ tool with a HFRF source operating at a frequency of 13.56 MHz and with a reactor pressure of about 2 Torr for the oxide deposition and about 9 Torr for the nitride deposition.

Referring to FIG. 6, the effect of varying the duty cycle in the pulsed plasma enhanced chemical vapor deposition (PECVD) process is illustrated. FIGS. 6a and 6b are plots of the deposited film thickness per unit time the high frequency RF power of the plasma is on (referred to as "thickness per deposition time") versus duty cycle. FIG. 6a illustrates the effect for a silicon nitride deposition, and FIG. 6b illustrates the effect for a silicon oxide deposition. For silicon nitride deposition with pulsed PECVD, a thickness per deposition time of less than 10 nm per minute can be achieved. Similarly, for silicon oxide, a deposition time of less than 30 nm per minute can be achieved. Note that 100% duty cycle represents no pulsing and is to be considered the baseline performance (i.e., conventional PECVD). The thickness per deposition time decreases with decreasing duty cycle, improving the control of the deposition process.

Figure 7:
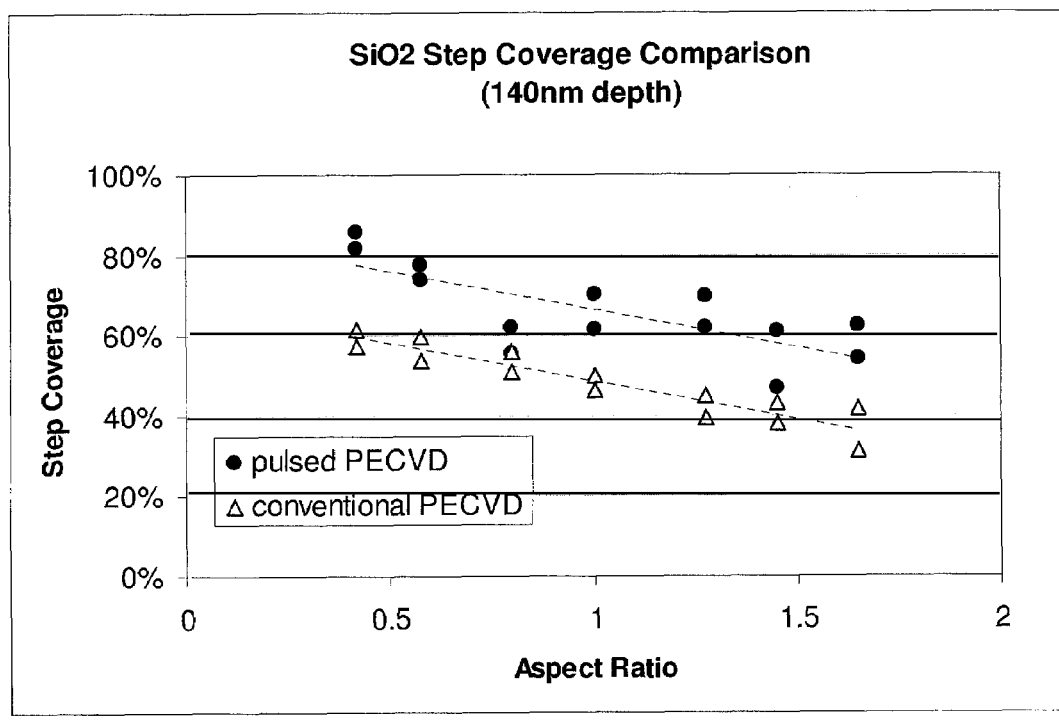
FIG. 7 depicts a plot showing the effect of pulsed PECVD versus conventional PECVD on step coverage for silicon oxide deposition in accordance with one aspect of the present invention.

Referring to FIG. 7, the effect of the pulsed PECVD process on the step coverage for silicon oxide is illustrated. FIG. 7 compares the step coverage for pulsed PECVD and conventional PECVD (i.e., no pulsing of the high frequency RF power) of silicon oxide on a substrate with feature depths of 140 nm. Step coverage is the ratio of the sidewall thickness and the bottom thickness for a given step. As shown in the figure, pulsed PECVD generally increases the step coverage approximately 15% for silicon oxide. Similar results are seen in pulsed PECVD for silicon nitride.

Figure 8:
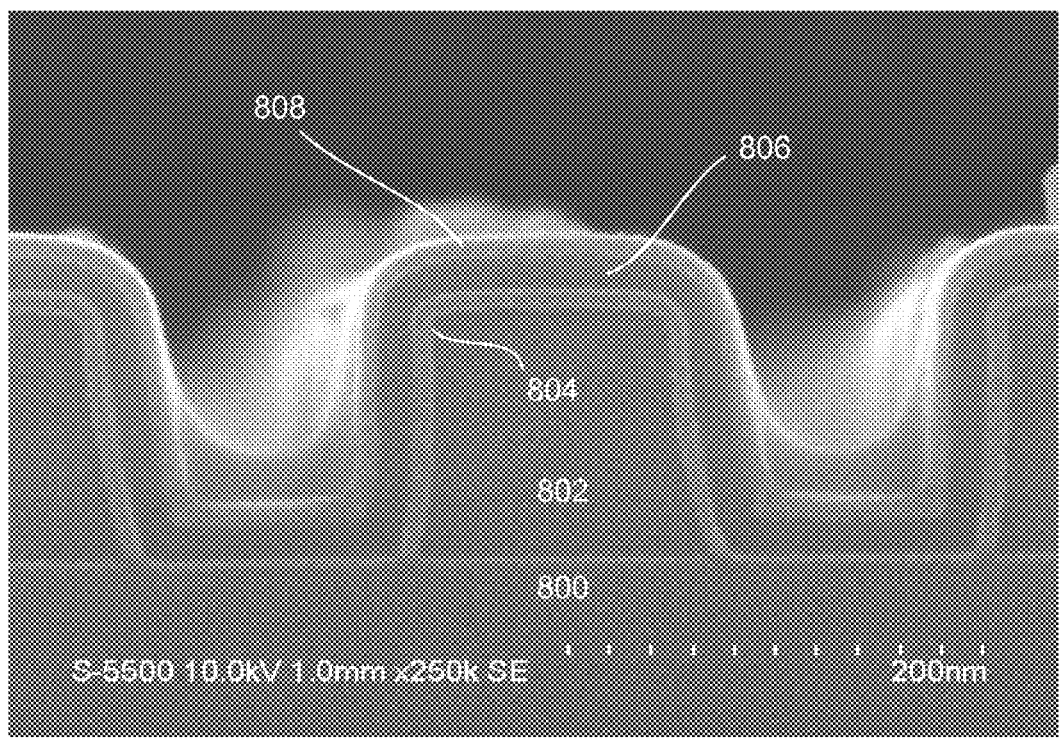
FIG. 8 is a scanning electron micrograph of a silicon nitride film with near 100% step coverage deposited with pulsed PECVD.

FIG. 8 is a scanning electron micrograph of a pulsed PECVD deposited silicon nitride film with near 100% step coverage. An approximately 5 nm decorative cap 804 of amorphous silicon was deposited on a silicon wafer 800 with a feature 802 using conventional PECVD. Then, approximately 20 nm of silicon nitride 806 was deposited on the decorative cap via pulsed PECVD. The silicon nitride was deposited in a Novellus Vector™ tool with a 500 Hz pulse frequency and a 15% duty cycle using silane and ammonia as precursors. Another approximately 5 nm decorative cap 808 of amorphous silicon was deposited on the silicon nitride. The silicon wafer was then cleaved and the edge dipped into a 1% HF solution to highlight the different layers. Note that the amorphous silicon decorative caps are not critical to the PECVD process. The decorative caps simply aid in interpretation of the scanning electron microscopy (SEM) image by providing a contrast layer above and below the silicon nitride.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of forming a silicon-based dielectric film, comprising:
    providing a semiconductor device substrate in a deposition chamber; and,
    depositing on the substrate a silicon-based dielectric film by a single process operation using pulsed plasma enhanced chemical vapor deposition wherein the high frequency radio frequency power of the plasma is pulsed at a frequency of 1 Hz to 10 kHz.

2. The method of claim 1, wherein the high frequency radio frequency power of the plasma is pulsed at a frequency of 75 to 500 Hz with a duty cycle of 15 to 99%.

3. The method of claim 1, wherein the high frequency radio frequency power of the plasma is pulsed at a frequency of 500 Hz with a 15% duty cycle.

4. The method of claim 1, wherein the high frequency radio frequency power of the plasma is pulsed with a duty cycle at least long enough to generate a reactive species in a precursor.

5. The method of claim 1, wherein the high frequency radio frequency power of the plasma has a frequency of 2 to 60 MHz.

6. The method of claim 1, wherein the high frequency radio frequency power of the plasma has a frequency of 13.56 Mhz.

7. The method of claim 1, wherein there is a low frequency radio frequency power of the plasma.

8. The method of claim 7, wherein the low frequency radio frequency power of the plasma has a frequency of 50 to 500 kHz.

9. The method of claim 7, wherein the low frequency radio frequency power of the plasma has a frequency of 400 kHz.

10. The method of claim 1, wherein the silicon-based dielectric film is deposited on a photoresist on the semiconductor device substrate.

11. The method of claim 1, wherein the silicon-based dielectric film is deposited on bare silicon on the semiconductor device substrate.

12. The method of claim 1, wherein the silicon-based dielectric film is silicon nitride formed using a silicon precursor and a nitrogen precursor.

13. The method of claim 12 wherein the thickness per deposition time of the silicon nitride is less than 10 nm per minute.

14. The method of claim 12, wherein the silicon precursor is selected from the group consisting of silane and tetraethyl orthosilicate (TEOS) and the nitrogen precursor is selected from the group consisting of ammonia, nitrogen, and hydrazine.

15. The method of claim 12, wherein the silicon precursor is silane and the nitrogen precursor is nitrous oxide.

16. The method of claim 1, wherein the silicon-based dielectric film is silicon oxide formed using a silicon precursor and an oxygen precursor.

17. The method of claim 16, wherein the thickness per deposition time is less than 30 nm per minute.

18. The method of claim 16, wherein the silicon precursor is selected from the group consisting of silane and tetraethyl orthosilicate (TEOS) and the oxygen precursor is selected from the group consisting of nitrous oxide, oxygen, ozone, and water.

19. The method of claim 16, wherein the silicon precursor is tetraethyl orthosilicate (TEOS) and the oxygen precursor is oxygen.

20. The method of claim 1, wherein the high frequency radio frequency power of the plasma is pulsed such that the high frequency radio frequency power is not turned off during the pulses.

21. The method of claim 1, wherein the high frequency radio frequency power of the plasma is pulsed such that the high frequency radio frequency power is increased over a period of time and decreased over a period of time instead of being turned on and off.

22. The method of claim 1 wherein the step coverage of the silicon-based dielectric film is better than the step coverage of a silicon-based dielectric film produced by a plasma enhanced chemical vapor deposition process wherein the high frequency radio frequency power of the plasma is not pulsed.

23. A semiconductor processing apparatus for depositing on a substrate a silicon-based dielectric film comprising:
   a chamber having a substrate holder, an inlet for process gases, and a connection to a vacuum source including:
   a high frequency radio frequency generator capable of pulsing the high frequency radio frequency power of a plasma; and
   a controller configured to execute a set of instructions, the set of instructions including instructions for depositing on the substrate a silicon-based dielectric film by a single process operation using pulsed plasma enhanced chemical vapor deposition wherein the high frequency radio frequency power of the plasma is pulsed, the instructions comprising:
   injecting one or more precursor gases into the chamber; and
   pulsing the high frequency radio frequency power of the plasma at a frequency of 1 Hz to 10 kHz.

* * * * *